(12) United States Patent
Wirz et al.

(10) Patent No.: US 6,171,049 B1
(45) Date of Patent: Jan. 9, 2001

(54) METHOD AND DEVICE FOR RECEIVING, ORIENTATING AND ASSEMBLING OF COMPONENTS

(75) Inventors: Gustav Wirz, Berg; Martin Forster, Riedt, both of (CH)

(73) Assignee: Alphasem AG, Andhauserstrasse (CH)

( * ) Notice: Under 35 U.S.C. 154(b), the term of this patent shall be extended for 0 days.

(21) Appl. No.: 09/117,113
(22) PCT Filed: Feb. 29, 1996
(86) PCT No.: PCT/CH96/00064
  § 371 Date: Jul. 23, 1998
  § 102(e) Date: Jul. 23, 1998
(87) PCT Pub. No.: WO97/32460
  PCT Pub. Date: Sep. 4, 1997
(51) Int. Cl.[7] ................................................. B32B 31/04
(52) U.S. Cl. ................ 414/680; 414/749.4; 414/223.02; 29/740; 198/339.1
(58) Field of Search ......................... 414/223.01, 223.02, 414/737, 736, 764, 749.4, 680; 29/740; 198/339.1

(56) References Cited

U.S. PATENT DOCUMENTS

| | | | |
|---|---|---|---|
| 4,626,167 | * 12/1986 | Bond et al. | 414/223.01 |
| 4,666,358 | * 5/1987 | Wojciechowski | 414/223.01 |
| 5,310,039 | * 5/1994 | Butera et al. | 414/223.01 |
| 5,575,610 | * 11/1996 | Soyama | 414/749.4 |
| 5,612,068 | * 3/1997 | Kempf et al. | 414/223.01 |
| 5,779,426 | * 6/1998 | Ishikawa et al. | 414/736 |

* cited by examiner

*Primary Examiner*—Gregory A. Morse
(74) *Attorney, Agent, or Firm*—Shoemaker and Mattare, Ltd.

(57) ABSTRACT

Workpieces such as chips are removed from a receiving plane by a transfer unit, which carries them to a delivery plane. The workpieces are transported in two segments during two phases, each workpiece being deposited between the phases on an intermediate station arranged in the region of the feed path. The transfer unit has two working heads, which simultaneously transport one workpiece from the receiving plane to the intermediate station, and another workpiece from the intermediate station to the delivery plane. The workpiece can be pivoted or rotated at the intermediate station so that its lower surface can be grasped by the depositing head.

17 Claims, 5 Drawing Sheets

METHOD AND DEVICE FOR RECEIVING, ORIENTATING AND ASSEMBLING OF COMPONENTS

BACKGROUND OF THE INVENTION

The invention relates to a method for the cycled receiving, placing and depositing of a preferably flat subject on an operating station, in particular on a chip loading automatic machine. With this for example chips must be removed from a wafer or a magazine arranged in the receiving plane and with a high precision and with great speed deposited on an underlay lying in the dispensing plane in a cycled manner.

The receiving plane and the dispensing plane may at the same time be arranged parallel and possibly may also lie in the same plane. The placing path should however be as small as possible and the masses to be accelerated should likewise be small. By way of the company document Alphasem AG, CH-8572, Berg, Switzerland a method and a device of a comparable type has become known in which the receiving plane and the dispensing plane are arranged at right angles to one another. A pivoting arm with a single receiving head carries out a 90° pivoting movement and with this transports chips from a rigidly clamped wafer to underlays which are led past in a cycled manner. The cycle speed may be increased with this arrangement compared to other transfer units.

A disadvantage of all known methods and devices however lies in the fact that the subjects over the whole placing path are always grasped on the same side and with this do not change their relative position to the transfer unit. At the same time a position change during transport or even a turning of the flat subject about 180° is not possible. In certain areas of application, in particular in electronics it would however be desirable to deposit the subject with the upper side face down.

SUMMARY OF THE INVENTION

It is therefore the object of the invention to provide a method of the previously mentioned type with whose help on covering the placing path, selectively a relative position change of the subject is possible. In particular on a chip loading automatic machine the dies removed from a wafer should be able to be deposited with the active side face down (flip-ship). According to the invention this object is achieved with a method as described hereafter.

The subdividing of the placing path into two different placing cycles permits the subject at the intermediate station arranged in the region of the placing path to change its position, in particularly to turn completely. Since the gripping means grips the subject essentially laterally the upper side and the lower side of the subject remain free in order to grasp it. By way of the simultaneous transport of a subject from the receiving plane to the intermediate station and from the intermediate station to the dispensing plane no time is lost in spite of the two-cycle advance.

For a certain operating method the subject is gripped on the upper side at the receiving plane and transported to the intermediate station. At the intermediate station it is flipped over and gripped on a lower side in order to be deposited with the upper side on the dispensing plane. Of course it is however also conceivable to grip the subject again on the upper side and with this to leave it in the same position, or where appropriate by turning about any spacial axis to bring it only into a somewhat different angular position which is more advantageous for the further transport and/or for the depositing on the dispensing plane. Advantageously the subject independently of its relative position at the intermediate station, in its relative position with respect to the dispensing plane, is displaced forwards between a receiving position in which the subject is clamped and a dispensing position in which the subject is dispensed. By way of this the course of movement can be simplified and the intermediate station does not have to be arranged exactly at half the path of the placing path.

Preferably the subject at the intermediate station is held by way of a pneumatically activatable clamping device with which flexible tubing sections for clamping are inflated and for releasing are contracted. In this manner without danger of damage also very thin components may be exactly held. Annoying gripping jaws or likewise do not occur so that the whole surface of the subject remains free on both sides. According to the nature of the subject it is of course also possible to hold this at the intermediate station by way of clamping jaws. These clamping jaws may grasp the subject in various ways and they may be motorically driven or also activated with other means, such as e.g. electromagnetically, by heat expansion, etc.

The invention also relates to a device for the cycled receiving, placing and depositing of a flat subject, as described herafter. In contrast to the known devices the transfer unit is equipped with two operating heads, specifically each with a receiving head and with a depositing head. The receiving head has the purpose of transporting the subject from the receiving plane to the intermediate station and the depositing head fetches the subject from here and transports it to the dispensing plane, wherein the subject at the intermediate station may be selectively changed in its lateral position. This separation into two operating heads has additionally also the advantage that the heads only have to cover very small distances.

The intermediate station is rotatably and/or pivotably mounted about any spacial axis such that the subject on an upper side can be gripped with the receiving head and clamped into the gripping means and that on a lower side it can be gripped with the depositing head and removed by the gripping means. With this the intermediate station is preferably rotatably mounted on a pivoting lever about a rotational axis. The pivoting lever axis at the same time is connected to the rotational axis by a gear in a manner such that on pivoting the pivoting lever the rotational axis selectively stands still or rotates. By way of these relatively simple mechanics the intermediate station in the course of a pivoting movement of the pivoting lever may be moved in a manner such that the pivoting movement is compensated and the subject still assumes the same relative position even at the end of the pivoting movement. If on the other hand the rotational position is fixed, the clamped subject co-pivots and in this manner changes its relative position.

Alternatively to the geared connection of the pivoting lever to the rotational axis the intermediate station may of course also be moved via a separate drive, for example via an electric motor arranged directly at the intermediate station or via a pneumatic drive.

The gripping means on the intermediate station advantageously comprise at least one flexible contact surface which can be inflated under pressure for grasping the subject and which can be contracted under a vacuum for releasing the subject. The gripping means may at the same time comprise two support profiles arranged at a distance wherein the flexible contact surfaces are formed by tubing sections which are slid over the support profiles. Alternatively one side of the gripping means may be formed as a rigid abutment in order to achieve a defined positioning. There further results a particularly useful arrangement when the support profiles on one side are fastened onto a holder, when the tubing sections are in operating connection with a cavity in the holder and when the holder is rotatable about a rotational axis which is formed as a hollow axis and via which the cavity may be connected to a pressure source or a vacuum source.

In order to keep the transport path as small as possible the receiving plane and the dispensing plane are inclined at an angle of preferably 90° to one another. With this the transfer unit is formed as a pivoting arm on which in the same pivoting plane, the receiving head and the dispensing head are angularly displaced to one another. Such an arrangement of the planes however would not be possible in all cases of application. It is therefore conceivable without further ado for the receiving plane and the dispensing plane to run parallel to one another, and this possibly being in one and the same plane. The transfer unit may at the same time carry out a linear movement or it may likewise carry out a pivoting movement, wherein however the pivoting plane would run parallel and not at right angles to the receiving plane or to the dispensing plane. If the pivoting arm is arranged on a carriage which is displaceable in various spacial axes and which also carries the intermediate station, subjects which lie in the same plane next to one another may be transferred. The carriage then in each case drives the transfer unit in the correct receiving position.

BRIEF DESCRIPTION OF THE DRAWINGS

One embodiment example of the invention is represented in the drawings and subsequently is described in more detail. There are shown.

DESCRIPTION OF THE PREFERRED EMBODIMENT

Figure 1:
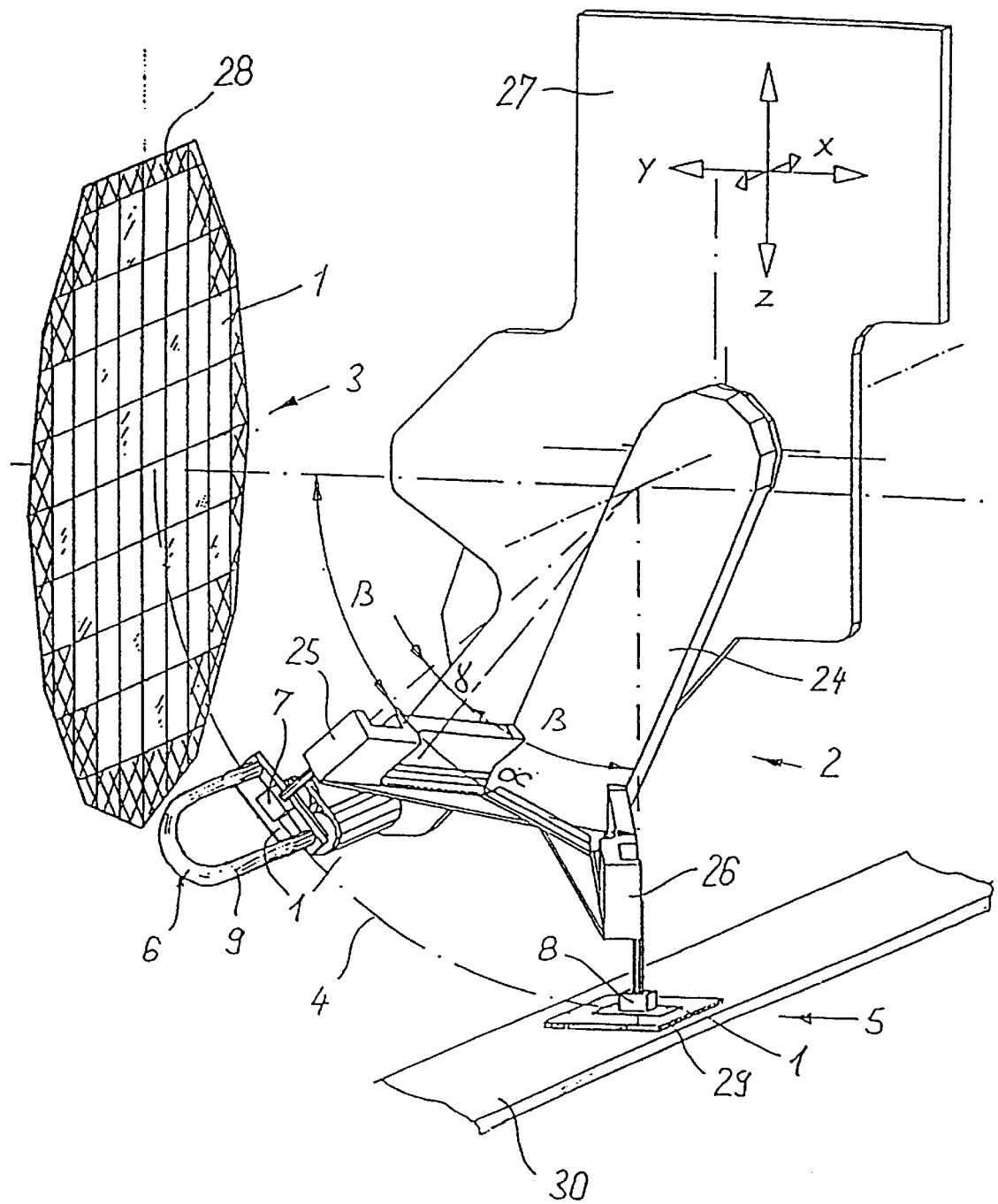
FIG. 1 the perspective representation of a transfer unit for transporting chips or dies from a wafer onto an underlay, FIG. 2 a section through an intermediate station fastened onto a pivoting lever, FIG. 3 a schematic representation of the intermediate station on turning a subject, FIG. 4 a schematic representation of the intermediate station on plane-parallel movement of a subject, FIG. 5 a heavily enlarged cross section through the gripping means of the intermediate station on clamping a subject, FIG. 6 the gripping means according to FIG. 5 on releasing a subject, FIGS. 7a to 7d the course of movement of the transfer unit and according to FIG. 1 on transfer with a turning procedure, and FIGS. 8a to 8d the transfer unit according to FIG. 1 with a transfer without a turning procedure.

FIG. 1 shows by way of example the operating station of a chip loading automatic machine with which from a wafer 28 clamped in the receiving plane 3 individual chips 1 must be removed and placed onto an underlay 29 which is guided past on a transport device 30 in a cycled manner. At the same time the underlay 29 runs in the dispensing plane 5. The receiving plane 3 and the dispensing plane 5 are arranged at right angles to one another so that an individual chip 1 on a placing path 4 must cover a pivoting movement of in total 90°. The placing path is covered with the help of a transfer unit 2 which here is formed as a pivoting arm 24. The transfer unit is fastened on a carriage 27 which may be moved in the spacial axes x, y and z so that the transfer unit may move to each and any coordinates on the receiving plane and/or on the dispensing plane. The technology of chip processing of a so-called die-bonder is generally known to the man skilled in the art and is therefore not repeated here.

The transfer unit 2 is provided with two operating heads, specifically with a receiving head 7 and a depositing head 8. The two heads are arranged on the part arms 25 and 26 on the same pivoting plane, displaced to one another at a tool angle α of e.g. 50°. The pivoting arm 24 may be pivoted about a pivoting angle β of e.g. 40° wherein evidently the two tool heads 7 and 8 in their angular movement never overlap but continuously remain distanced from one another about a difference angle γ of e.g. 10°. The receiver head 7 and the depositing head 8 are formed in the manner known per se such that yet a further lifting movement may be covered for receiving or depositing. The heads operate pneumatically and hold a chip 1 on the placing path with a vacuum or again release it from the head with an excess pressure. Of course also heads which grasp and release a subject with other means, for example with electromagnetic means would also be conceivable.

The drive for the pivoting arm 24 may be effected in a different way and manner. Preferably the pivoting movement is controlled by a Geneva motion so that the respective angular position can be travelled to very slowly. Such motions are however likewise known to the man skilled in the art and are here not described in detail.

In the region of the placing path 4 an intermediate station 6 is fastened on a carriage 27 in a way and manner which is subsequently yet to be described in detail. This intermediate station has at its disposal gripping means 9 with whose help a chip 1 is clamped and held in the edge region. On covering the pivoting angle β the receiving head 7 transports a chip 1 in each case only from the receiving plane 3 to the intermediate station 6, whilst simultaneously the depositing head 8 transports a second chip from the intermediate station to the dispensing plane 5. Evidently at the same time for receiving or receiving a chip also the intermediate station 6 must be moved about the difference angle γ since the two heads 7 and 8 each do not completely cover half of the placing path 4. However applications are conceivable with which a relative movement of the intermediate station is not necessary and with which both heads 7 and 8 reach the stationary intermediate station.

According to which manner the intermediate station 6 is moved and at the same time covers the difference angle γ, a chip 1 grasped on its upper side or its active side is completely turned so that it is grasped by the depositing head 8 on its lower side, or also the chip remains the same in its relative position and again is grasped by the depositing head 8 on its upper side or active side. Both operating types are possible with the device shown and for conversion only simple hand grips are required. Details of the function of this intermediate station can be seen from FIG. 2.

The intermediate station 6 is rotatably mounted on a pivoting lever about a rotational axis 12 about its own axis. The rotational axis 12 is formed as a hollow axis which also serves for supplying the pneumatic gripping means with pressure or with a vacuum. The pivoting lever 13 is connected to a pivoting lever axis 14, which for example is mounted in a bearing sleeve 32 by way of roller bearings. The rotational drive is effected via a belt drive 34 which is preferably coupled to the drive for the pivoting arm 24 (FIG. 1).

Figure 3:
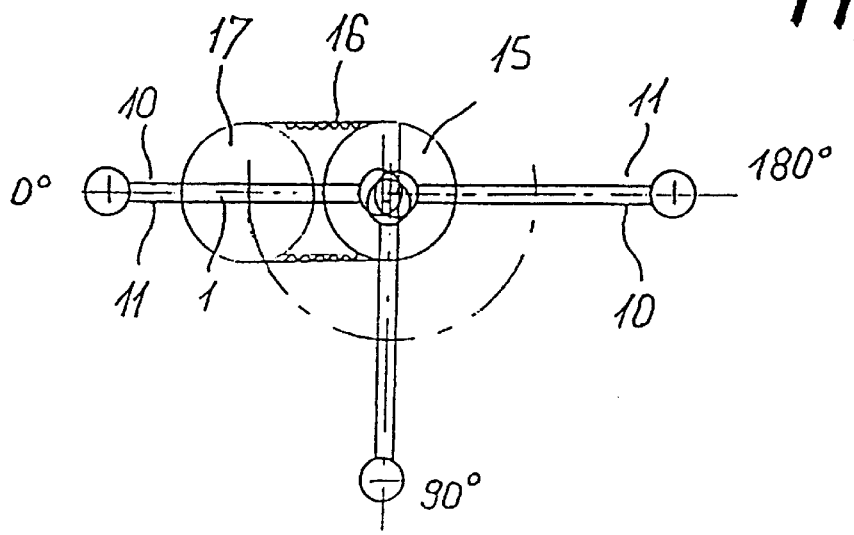
Figure 4:
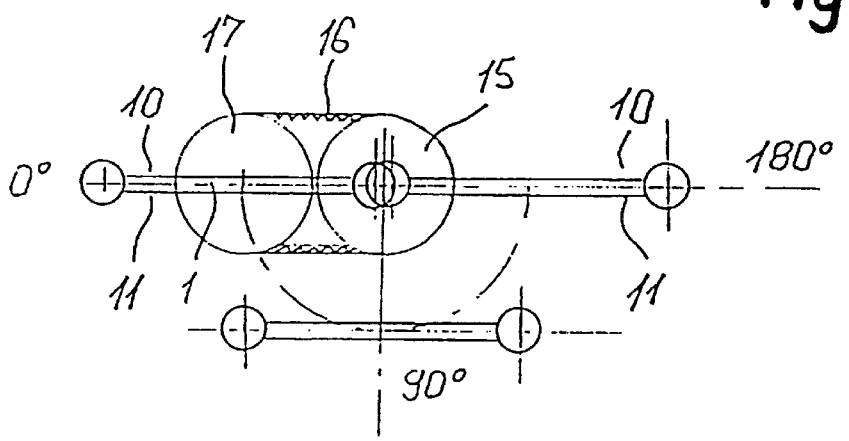

A geared connection between the pivoting lever axis 14 and the rotational axis 12 is effected via a drive wheel 15 and a drive wheel 17. Since the rotational movement of these wheels must be in the same direction they are coupled to one another via a toothed belt 16 (FIGS. 3 and 4). It would however also be conceivable to apply intermediate wheels. The drive wheel 15 is mounted via a roller bearing 31 on the pivoting lever axis 14 in a manner such that with respect to this pivoting lever axis it is freely rotatable. By way of a clamping screw 19 the drive wheel 15 may however be connected to the pivoting lever axis 14 with a positive fit. Alternatively the drive wheel 15 may also however be locked with respect to the pivoting lever axes mounting by way of a clamping screw 18. Alternatively to the clamping screws the locking may of course be achieved also with other design means, such as e.g. a latching device or likewise. These two operating types of the drive wheel 15 effect two different relative movements of the intermediate station 6 which are shown in the FIGS. 3 and 4. These figures in a heavily schematised manner show a plan view, in the direction of the rotational axis 12 or the pivoting lever axis 14, with the drive wheel 15, the toothed belt 16 and the drive wheel 17. Between the gripping means there is clamped a chip 1 with an upper side 10 and with a lower side 11. Represented are in each case three pivoting positions of the pivoting lever 13 about 0°, 90° and 180°.

If the drive wheel 15 is locked with respect to the pivoting lever axis 14 by way of the clamping screw 19, then this wheel pivots together with this lever axis and the toothed belt 16 does not transmit any rotational movement onto the drive wheel 17. The rotational axis 12 thus remains stationary and the position of the intermediate station 6 remains as a whole unchanged relative to the pivoting lever 13. An unclamped chip 1 is at the same time turned about 180° so that the lower side 11 now lies face up and the upper side 10 face down. This situation is represented in FIG. 3. The behaviour is different when the drive wheel 15 is locked by way of the clamping screw 18 relative to the mounting of the pivoting lever axis 14. In this case the rotational axis 12 with the drive wheel 17 rotates about the stationary drive wheel 17 wherein via the toothed belt 16 a relative rotational movement is exerted on the drive wheel 17. With this the transmission ratio is selected such that by way of this relative movement the intermediate station 6 is pivoted plane-parallel, as is shown in FIG. 4. In the 90° position as well as in the 180° position the upper side 10 always lies face up and the lower side face down. In both operating modes according to the FIGS. 3 and 4 the intermediate station 6 with respect to the pacing path 4 according to FIG. 1 covers the difference angle γ of 10°.

Figure 2:
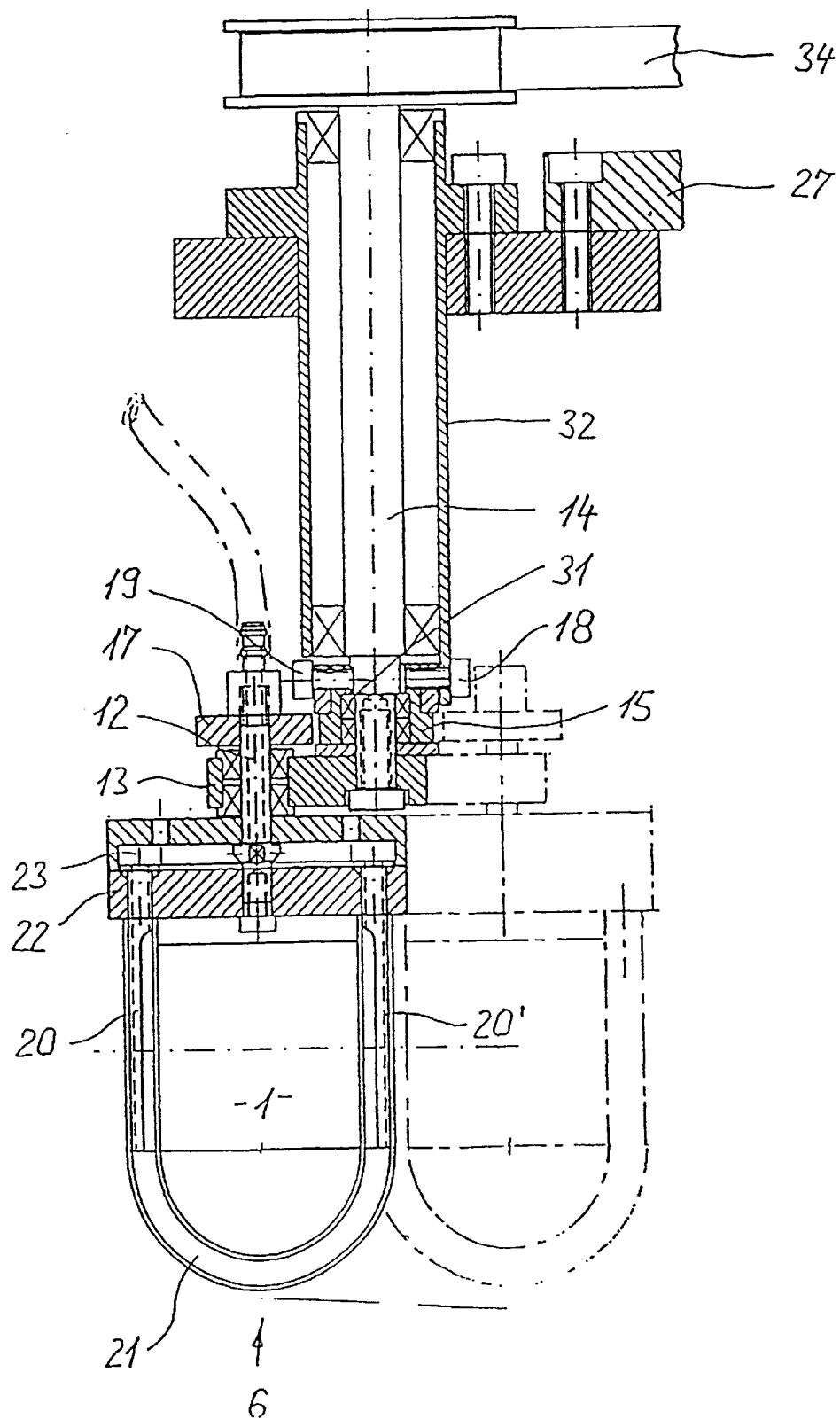
Figures 5, 6:
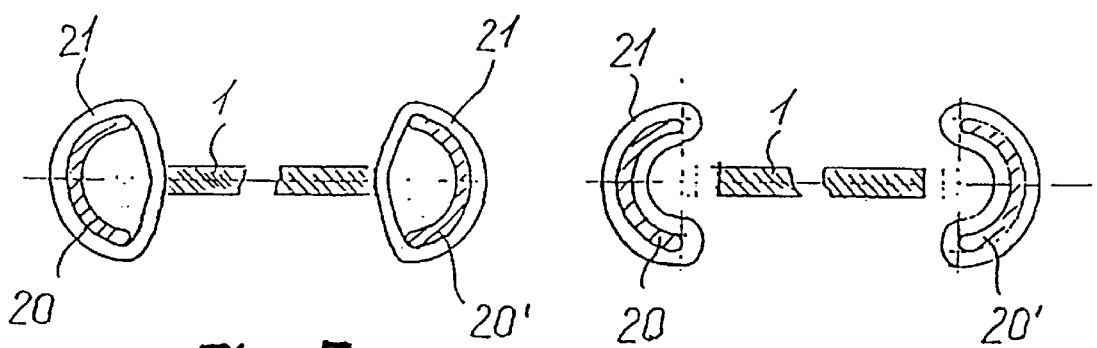

Details of the gripping means on the intermediate station are described by way of FIGS. 2, 5 and 6. The gripping means consist of two support profiles 20 and 20' with a c-shaped cross section, which are arranged at a distance and facing one another. These profiles are formed by tubes whose casing is cut away in regions. At the same time the tube projections are inserted into a holder 22 which comprises a cavity 23. The rotational axis 12 formed as a hollow axis is in operating connection with this cavity. A flexible tubing 21 is pushed onto the two support profiles 20 and 20' and this being such that the two parallel tubing sections are connected to one another on the support profiles in an arch-shaped manner. The distance between the support profiles is selected such that a chip 1, given an inflated tubing, may be grasped on the parallel lateral edges, as is shown in FIG. 5. If the tubing is contracted under a vacuum then it adapts to the configuration of the support profiles 20 and 20' and the chip 1 is released (FIG. 6). Pressure and vacuum are applied by way of a suitable control at the correct point in time via the rotational axis 12.

Figure 7A:
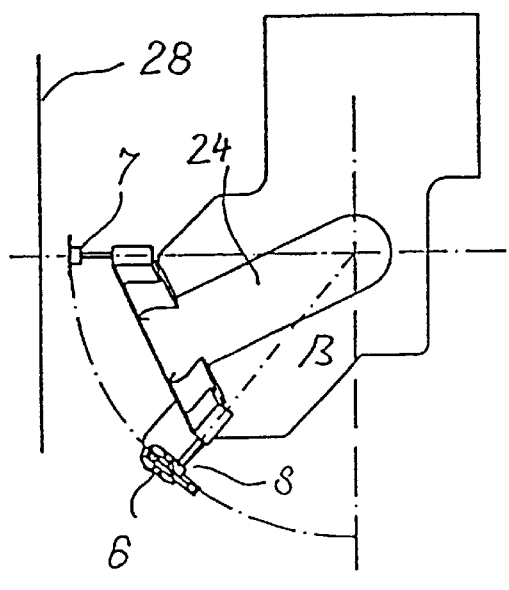

By way of the FIGS. 7*a* to 7*d* subsequently in four sequences the operation of the device in the so-called flip mode is described in which a chip with its active side face down is laid onto an underlay. FIG. 7*a* shows the operating cycle in which the receiving head 7 has lifted a chip 1 from the wafer 28. At the same time the depositing head 8 grasps a chip at the intermediate station 6. The pivoting arm 24 begins its pivoting angle β of 400.

Figure 7B:
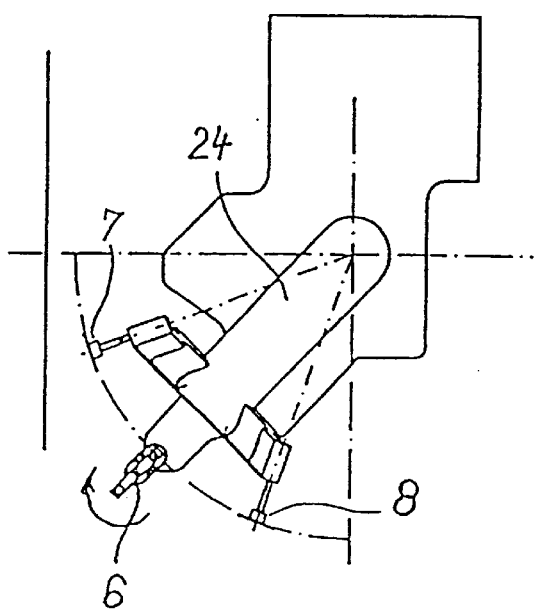

In FIG. 7*b* the pivoting arm 24 has covered half the pivoting angle of 20°. Both tool heads 7 and 8 each hold a chip and the intermediate station 6 pivots back into the receiving position wherein it assumes the 90° position according to FIG. 3. This position in reality does not correspond to an operating cycle, but rather in the course of a continuous movement is only cycled once.

Figure 7C:
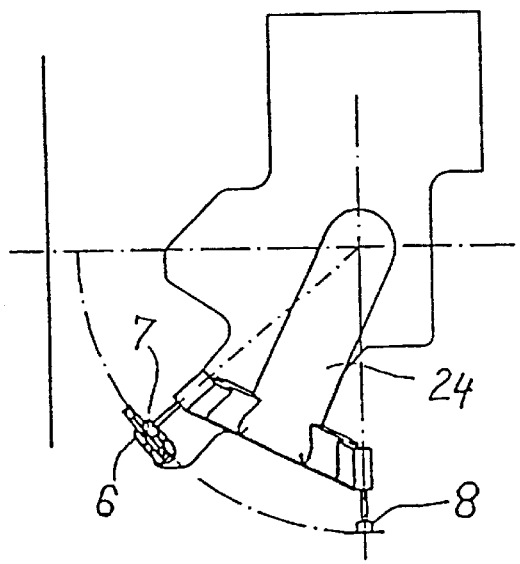

FIG. 7*c* shows the operating cycle in which the complete pivoting angle has been covered. The depositing head 8 has brought its chip into the end position in which it can be deposited onto the dispensing plane. Simultaneously the intermediate station 6 is also completely pivoted back into the receiving position and may then with its gripping means take over the chip which is placed in readiness in the correct position by the receiving head 7.

Figure 7D:
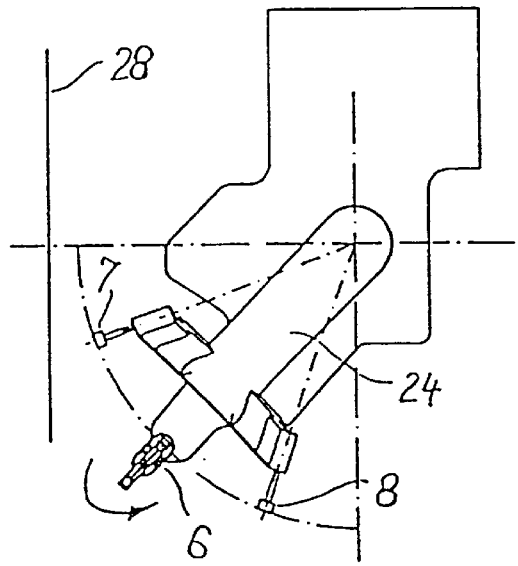

FIG. 7*d* shows the pivoting arm 24 on pivoting back over half the pivoting angle analogously to FIG. 7*b*. The receiving head 7 and the depositing head 8 are however empty. The intermediate station 6 loaded with a chip pivots back into the receiving position and with this turns the chip head over. Lastly the position according to FIG. 7*a* is again assumed in which the transfer procedure begins afresh.

Figure 8A:
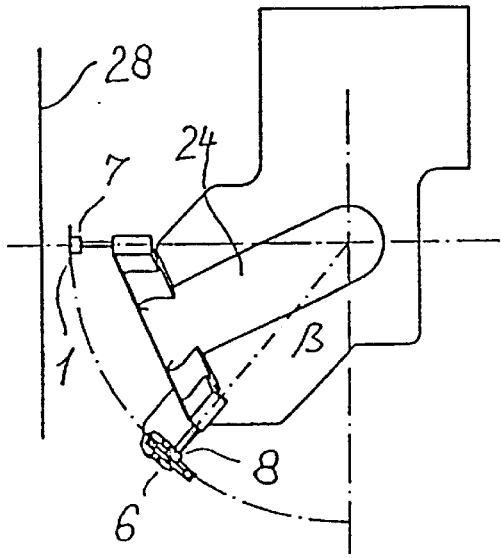
Figure 8B:
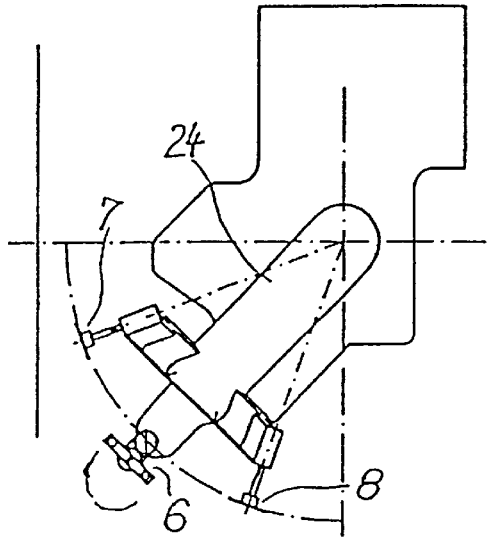
Figure 8C:
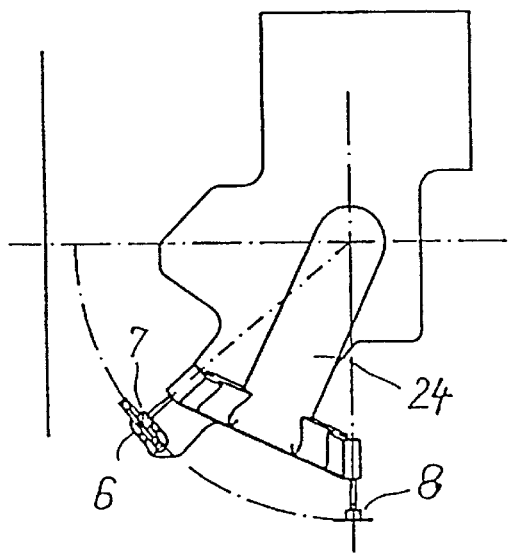
Figure 8D:
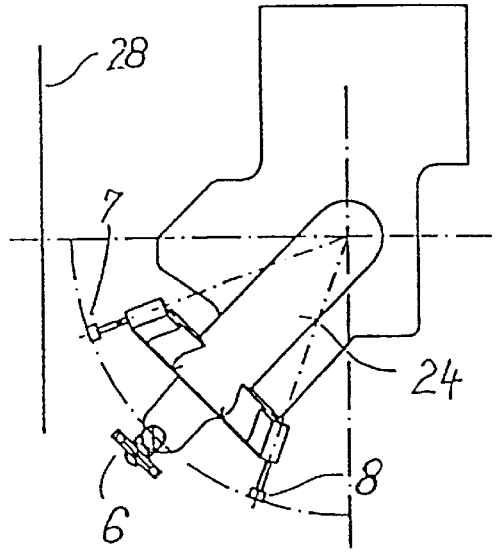

The FIGS. 8*a* and 8*d* show a transfer movement in normal operation, this means without turning the chip head over. The original position according to FIG. 8*a* is basically the same as with FIG. 7. The receiving head 7 has removed a chip 1 from the wafer 28 and the depositing head 8 grips the chip which has hitherto been clamped on the intermediate station 6.

On pivoting back the pivoting arm 24 over half the pivoting angle according to FIG. 8*b* both heads 7 and 8 are loaded with a chip, the empty intermediate station pivots back, wherein however the pivoting movement is compensated by the gear and the intermediate station assumes the 90° position according to FIG. 4.

According to FIG. 8*c* the depositing head 8 has reached its depositing position and the intermediate station 6 is ready for receiving the chips on the receiving head 7.

On pivoting back the pivoting arm 24 according to FIG. 8*d* the loaded intermediate station 6 also pivots again into the receiving position, but however without turning the chip. As is represented in FIG. 8*a* the chip is subsequently again gripped on its upper side by the depositing head 8 and is transported further and finally is deposited onto the underlay with its lower side.

We claim:

1. A method for receiving, placing and depositing flat objects on an operating station by means of a movable transfer unit, said method comprising steps of moving one of said flat objects from a receiving plane along a placing path, through an intermediate station, to a dispensing plane, said moving step being performed in two separate phases so that said object covers the path in two segments thereof, simultaneously transporting one object from the receiving plane to the intermediate station and another object from the intermediate station to the dispensing plane, holding the object between said placing phases at said intermediate station, and selectively changing the relative lateral position of the object at the intermediate station between the two cycles.

2. A method according to claim 1, further comprising a step of inverting the object at the intermediate station whereby the object is deposited onto the dispensing plane in an inverted orientation.

3. A method according to claim 1, comprising moving the object at the intermediate station towards the dispensing plane, between a receiving position in which the object is clamped and a dispensing position in which the object is released.

4. A method according to claim 1, comprising holding the object at the intermediate station with a pneumatically activatable clamping device.

5. A method according to claim 1, comprising holding the object at the intermediate stations with clamping jaws.

6. A device for periodically receiving, placing and depositing flat objects at an operating station, said device comprising a movable transfer unit having means for moving said objects individually from a receiving plane, over a transfer path and onto a dispensing plane, wherein the transfer unit comprises a receiving head and a depositing head, and an intermediate station within the transfer path, said intermediate station having means for gripping the object substantially laterally, said transfer unit being adapted to move in such a way that the receiving head transports a object from the receiving plane to the intermediate station and the depositing head transports a object from the intermediate station to the dispensing plane, and further comprising means for selectively changing the relative lateral position of the gripped object at the intermediate station between the two cycles.

7. A device according to claim 6, wherein the intermediate station is mounted for rotational movement in a manner such that the object can be grasped on an upper side with the receiving head and clamped by the gripping means and can be grasped on a lower side with the depositing head and removed from the gripping means.

8. A device according to claim 6, further comprising a pivoting lever which is pivotable about a pivoting lever axis, the intermediate station being mounted for rotation on said lever, and gearing selectively connectable to the pivoting lever axis or to a fixed axis in such a way that as the pivoting lever pivots, the rotational axis selectively stands still or rotates.

9. A device according to claim 8, wherein said gearing comprises a drive wheel, mounted on the pivoting lever axis, means for alternatively locking said drive wheel with the pivoting lever axis or with a bearing for the pivoting lever axis, a driven wheel connected to the intermediate station, and means interconnecting said drive wheel and said driven wheel.

10. A device according to claim 9, wherein the interconnecting means is a toothed belt engaging the drive wheel and the driven wheel.

11. A device according to claim 6, wherein the gripping means comprise at least one flexible contact surface adapted to grasp the object when inflated under pressure and to release the object when contracted under a vacuum.

12. A device according to claim 11, wherein the gripping means comprise a positive stop.

13. A device according to claim 11, wherein the gripping means comprise two support profiles arranged at a distance from one another, and wherein the flexible contact surfaces are formed by tubing sections installed over the support profiles.

14. A device according to claim 13, further comprising a holder, said support profiles being fastened on one side of the holder, said tubing sections being connected with a cavity in the holder and that the holder is rotatable about a rotational axis which is formed as a hollow axis via which the hollow space can be connected to a pressure source or to a vacuum source.

15. A device according to claim 6, wherein the receiving plane and the dispensing plane are inclined to one another at an angle of about 90° and that the transfer unit is formed as a pivoting arm on which the receiving head and the dispensing head are arranged angularly spaced relative to one another.

16. A device according to claim 15, further comprising a holder, movable on various spatial axes, which holder carries the intermediate station, said pivoting arm being arranged on said holder.

17. A device for placing a semiconductor chip on an underlay, said device comprising a movable transfer unit for receiving said chip from a first location, transporting the chip over an arcuate transfer path, and placing the chip on the underlay at a second location;

said transfer unit comprising both a receiving head and a depositing head, a pivoting arm on which the receiving head and the dispensing head are arranged angularly spaced relative to one another, and a carriage, movable on multiple axes, said pivoting arm being supported on said holder; and an intermediate station for transferring the chip from the receiving head to the depositing head, said intermediate station including a pivoting lever having a shaft extending through a bearing sleeve fixed to the holder, a drive wheel rotatably mounted on said pivoting lever shaft, means for alternatively locking said drive wheel to the pivoting lever shaft or to the bearing housing, a driven wheel connected to the intermediate station, and a toothed belt interconnecting the drive wheel and the driven wheel, whereby the intermediate station selectively rotates the chip as it passes the chip from the receiving head to the depositing head.

* * * * *